(12) United States Patent
Shi et al.

(10) Patent No.: US 8,877,555 B2
(45) Date of Patent: *Nov. 4, 2014

(54) FLIP-CHIP SEMICONDUCTOR CHIP PACKING METHOD

(71) Applicants: Lei Shi, Songjiang (CN); Yan Xun Xue, Los Gatos, CA (US); Yuping Gong, Songjiang (CN)

(72) Inventors: Lei Shi, Songjiang (CN); Yan Xun Xue, Los Gatos, CA (US); Yuping Gong, Songjiang (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 183 days.

This patent is subject to a terminal disclaimer.

(21) Appl. No.: 13/678,847

(22) Filed: Nov. 16, 2012

(65) Prior Publication Data

US 2014/0141567 A1 May 22, 2014

(51) Int. Cl.
*H01L 21/56* (2006.01)
*H01L 23/00* (2006.01)

(52) U.S. Cl.
CPC ..... *H01L 21/563* (2013.01); *H01L 2224/83192* (2013.01); *H01L 2224/73265* (2013.01); *H01L 2224/48247* (2013.01); *H01L 2224/32245* (2013.01); *H01L 2224/48091* (2013.01); *H01L 24/34* (2013.01); *H01L 2224/48465* (2013.01); *H01L 2224/92247* (2013.01); *H01L 2224/16245* (2013.01)
USPC ............... 438/108; 438/113; 257/E21.503

(58) Field of Classification Search
USPC ............................................. 438/106–127
See application file for complete search history.

(56) References Cited

U.S. PATENT DOCUMENTS

| 7,125,747 | B2 * | 10/2006 | Lee et al. ................. | 438/112 |
| 7,129,116 | B2 * | 10/2006 | Islam et al. ............... | 438/112 |
| 7,569,427 | B2 * | 8/2009 | Theuss ..................... | 438/127 |
| 7,723,161 | B2 * | 5/2010 | Kobayashi et al. ....... | 438/123 |
| 7,915,080 | B2 * | 3/2011 | Takahashi et al. ....... | 438/108 |
| 2005/0287709 | A1 * | 12/2005 | Lee et al. ................. | 438/122 |
| 2008/0116580 | A1 * | 5/2008 | Jiang et al. .............. | 257/766 |
| 2008/0224300 | A1 * | 9/2008 | Otremba ................. | 257/693 |
| 2008/0224323 | A1 * | 9/2008 | Otremba ................. | 257/778 |
| 2009/0087953 | A1 * | 4/2009 | Lin .......................... | 438/123 |
| 2011/0291252 | A1 * | 12/2011 | Hosseini ................. | 257/676 |
| 2012/0061819 | A1 * | 3/2012 | Siemieniec et al. ..... | 257/734 |
| 2012/0133053 | A1 * | 5/2012 | Lo et al. .................. | 257/777 |

* cited by examiner

*Primary Examiner* — Savitr Mulpuri
(74) *Attorney, Agent, or Firm* — Chein-Hwa Tsao; CHEmily LLC

(57) ABSTRACT

Preparation methods of forming packaged semiconductor device, specifically for flip-chip vertical power device, are disclosed. In these methods, a vertical semiconductor chip is flip-chip attached to a lead frame and then encapsulated with plastic packing materials. Encapsulated chip is then thinned to a predetermined thickness. Contact terminals connecting the chip with external circuit are formed by etching at least a bottom portion of the lead frame connected.

18 Claims, 9 Drawing Sheets

FLIP-CHIP SEMICONDUCTOR CHIP PACKING METHOD

CROSS REFERENCE TO RELATED APPLICATIONS

This application is a continuation application of a pending U.S. application entitled "POWER SEMICONDUCTOR DEVICE PACKAGE METHOD" by Lei Shi et al, with application Ser. No. 13/045,407, filing date of Mar. 10, 2011. The content is herein incorporated by reference for any and all purpose.

TECHNOLOGICAL FIELD

This invention generally relates to preparation methods for packaging of semiconductor device, and more particularly to methods of package for flip-chip in power device.

BACKGROUND

In advanced chip packaging methods, WLCSP (Wafer Level Chip Scale Packaging) is a method in which packaging and testing is performed on the entire wafer. The wafer's surface is coated with polyimide materials, and then single IC packaging chips are singulated, thus, the package size is almost equivalent to that of the original chip. This kind of package has good heat dissipation and electrical parameters, and other good performances.

Typically, in a complex process flow of WLCSP, the most important step is to thin a chip to a certain thickness. However, the thinner the chip, the easier to be broken, which requires a packaging method to avoid any form of damage caused to the chip during its processing steps. For example, wafer cutting can easily cause cracks at edges of the chip, which consequentially causes loss of angle in the resulted unqualified chips.

An example of a conventional package currently known as FBP (Flat Bump Package), in which, the package 150 in FIG. 1J is prepared according to the Process Flow in FIGS. 1A-1J. As shown in FIG. 1A, a lead frame 100 includes a contact terminal 101 and a bonding pad 102. As shown in FIGS. 1B-1C, chip 110 is connected to the bonding pad 102 through the conductive material 103. The chip 110 is electrically connected to the contact terminal 101 through the bonding line 104, as shown in FIG. 1D.

The plastic packing is then performed as shown in FIGS. 1E-1F. The chip 110 and bonding line 104 are encapsulated within plastic packing material 120. The lead frame 100 is etched from its bottom surface to obtain the contact terminal 101 and bonding pad 102 protruding out from plastic packing material 120. Then a gold layer is coated on outer surface of contact terminal 101 and bonding pad 102 to form a gold layer 105, as shown in FIG. 1G. A film layer 130 is pasted on the top surface 120a of the package as shown in FIG. 1H. The plastic packing material 120 is cut through the lines 120c and the film layer 130 is removed, which forms a completed package 150 including chip 110 and bonding line 104 covered with plastic packing material 120 as shown in FIG. 1I-1J.

In package 150, bonding pad 102 is used for heat dissipation or used as an electrode. The contact terminal 101 and bonding pad 102 are both connected on PCB and other bases that are connected with the external circuit. Because chip 110 is bonded on the bonding pad 102 resulting on its larger size, and a certain degree of arc height is required for bonding line 104, it against the requirement of reducing the thickness of plastic packing material 120. In addition, the bonding lines, such as bonding line 104, are likely to result in the negative effects of a discrete inductance. Therefore, the size and electrical performance of package 150 in FIG. 1J is not satisfactory.

Thus, the embodiments of the invention are arrived, which is based on the following considerations: the chip is firstly packed and then thinned to make the final package have a better size and have better heat dissipation and electrical parameters and other good performances; in the packaging process, chip's angle missing risk is reduced, and the thinner chip thickness is obtained.

SUMMARY

In view of the above problems, this invention proposes a package method for flip-chip. The process starts with a lead frame including a number of interconnect rods protruding from its top surface. A chip with bonding pads formed on its first surface is flip connected to said lead frame with said bonding pads connected with said interconnect rods. A top surface of lead frame is packed plastically to encapsulate the chip and interconnect rods with plastic packing materials. The lead frame is then etched from its bottom surface to form contact terminals that are connected with said interconnect rods and protrude from a bottom surface of plastic packing materials. A metal protective layer is coated on surface of said contact terminals and a film is pasted to a top surface of thinned plastic packing materials. The plastic packing material is then cut followed by removing of said film to form a number of packages in which the chip is encapsulated with the plastic packing materials.

In the above method, the bonding pads are connected to said interconnect rods through the conductive material coated on the interconnect rods.

In the above method, the bonding pads are eutectically connected with said interconnect rods through a metal deposited on interconnect rods and a metal deposited on bonding pad.

The above method also includes the steps of grinding and thinning of plastic packing materials and chip after the chip being packed with plastic packing materials, and exposing the back surface of said chip from top surface of plastic packing material after thinning.

The above method also includes the steps of depositing a metal layer on the exposed back surface of the chip after its being thinned.

The above said method, before depositing a metal layer on exposed back surface of chip and after its being thinned, also includes etching the back surface of thinned chip and ion implanting and laser annealing the back surface of thinned chip.

In the above method, said contact terminals protrude out from a bottom surface of plastic packing material, while the metal layer exposes from the top surface of plastic packing material.

In the above method, said chip is a metal-oxide-semiconductor field effect transistor (MOSFET), and said bonding pads include at least a gate electrode bonding pad that forms a gate electrode of the chip and a source electrode bonding pad that forms a source electrode of the chip, while the metal layer on exposed back surface of said chip forms a drain electrode of the chip.

In the above method, said package is attached to a base, in which the metal layer on exposed back surface of said chip is attached to the base through a conductive material. Contact terminal connecting the gate bonding pad is connected to a gate pin formed around the base through an electrical connection of a metal conductor. Other contact terminals connecting the source bonding pad are connected to the source pins formed around the base through an electrical connection of a metal conductor. Drain pins that are connected to the base through an electrical connection are also formed around the base.

The above method also includes the step of attaching said metal layer on said exposed back surface of said semiconductor chip to a flat portion of a conductive structure with a downward portion of said conductive structure extending to a surface coplanar to a bottom of said contact terminals.

In a preferred example of the above method, said chip is a common drain bi-MOSFET including first and second MOSFETs. The metal layers on exposed back surface of the chip forms respective drain electrodes of the first and second MOSFETs. The bonding pads also include the first gate bonding pads that forms the gate electrode of the first MOSFET and the first source bonding pads that forms the source electrode of the first MOSFET. The bonding pads also include the second gate bonding pads that forms the gate electrode of the second MOSFET and the second source bonding pads that forms the source electrode of the second MOSFET.

In a preferred example of the above method, said chip is a bi-MOSFET that is integrated with a high-end MOSFET and a lower-end MOSFET, in which, metal layers on exposed back surface of said chip forms the source electrode of high-end MOSFET and the drain electrode of lower-end MOSFET. The source electrode of high-end MOSFET and the drain electrode of lower-end MOSFET are connected to each other through the metal layer. The bonding pads include the first gate bonding pads that forms the gate electrode of the high-end MOSFET and the first drain bonding pads that forms the drain electrode in the high-end MOSFET. The bonding pads also includes the second gate bonding pads that forms the gate electrode of the lower-end MOSFET and the second source bonding pads that forms the source electrode in the lower-end MOSFET.

In a preferred example of the above method, said chip is a common drain bi-MOSFET, in which the exposed back surface of the chip forms the respective drain electrodes of the first and second MOSFETs. It is preferable that a metal layer is coated on exposed back surface of said chip, and the respective drain electrodes of the first and second MOSFETs are connected to each other through the metal layer electrically.

In the above method, said chip is a bi-MOSFET that is integrated with a high-end MOSFET and a lower-end MOSFET. An exposed back surface of said chip forms the source electrode of the high-end MOSFET and the drain electrode of lower-end MOSFET. It is also preferable that a metal layer is coated on exposed back surface of the said chip, and the source electrode of the high-end MOSFET and drain electrode of lower-end MOSFET are connected to each other through the metal layer electrically.

After reading of the following detailed description of preferred examples with reference to the attached drawings by the Technical staff in this field, the advantages of the above said and other characteristics are obvious for this invention.

DESCRIPTION OF DRAWINGS

With reference to the accompanying drawings, the examples of this invention are to be more fully described. However, the accompanying drawings are only for illustrative purposes and do not constitute a limitation on the scope of this invention.

SPECIFIC EXAMPLES

Figure 2A:
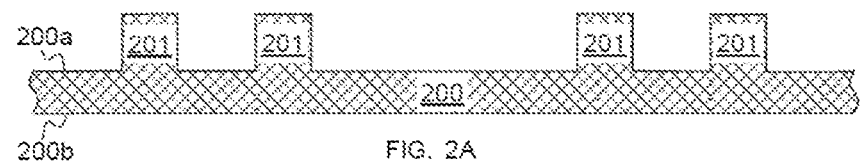
FIG. 2A-2L are cross-sectional views illustrating a preparation process diagram of the chip package in this application.
Figure 2B:
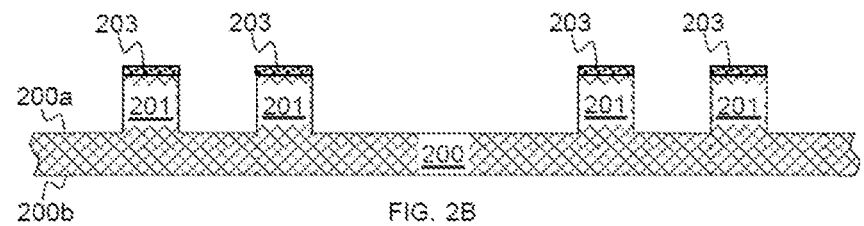
Figure 2C:
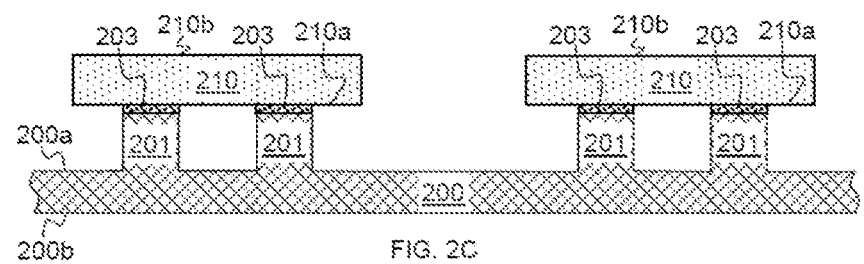

As shown in FIG. 2A, a number of interconnect rods 201 are formed on the top surface 200a of the lead frame 200 with the interconnect rods 201 protruding from a top surface 200a of the lead frame 200. By way of example, and not by way of limitation, the materials of lead frame 200 and rods 201 can be copper. As shown in FIG. 2A-2C, a conductive adhesive material 203 is disposed on top of the interconnect rods 201 firstly, and then a semiconductor chip 210 is flip-chip mounted to the lead frame 200 through conductive adhesive material 203.

Figure 4:
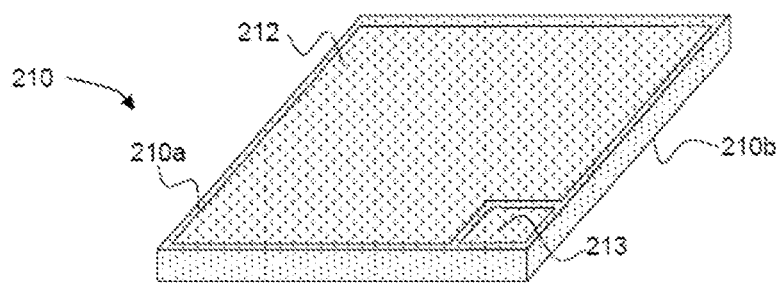
FIG. 4 is a 3-dimensional schematic diagram of an example of a MOSFET before it is packaged for this invention.

Bonding pads for electrical connection with the external circuit are usually formed on a top surface 210a of semiconductor chip 210, which generally used as the input/output contact terminal (I/O Pad) of internal circuit in chip 210 and can be used as interfaces of signal I/O or of Power and Ground. Take the chip layout of a MOSFET as shown in FIG. 4 for an example, the bonding pads formed on top surface 210a of chip 210 include at least a gate bonding pad 213 that forms a gate electrode of chip 210 and a source bonding pad 212 that forms a source electrode of chip 210, in which, the gate bonding pad 213 contacts a gate region (not shown) disposed on a top portion of chip 210, and the source bonding pad 212 contacts a source region (not shown) on a top portion of chip 210. In the case chip 210 is a vertical power MOSFET device, a drain region (not shown) is disposed on a bottom portion 210b of chip 210.

As shown in FIG. 2C, semiconductor chips 210 with bonding pads (not-shown) on its top surface 210a are flip-chip connected to the lead frame 200 with bonding pads connected to interconnect rods 210. For example, source bonding pad 212 and gate bonding pad 213 in FIG. 4 are connected with interconnect rods 201. A number of welding processes can be used. In an example, bonding pads are connected with the interconnect rods 201 through conductive adhesive material 203 coated on interconnect rod 201. By way of example, either solder paste, conductive silver paste or conductive film can be selected as the conductive adhesive material 203. In another example, bonding pads (source bonding pad 212, gate bonding pad 213) are connected with interconnect rods 201 eutectically through a metal layer deposited on interconnect rod 201 and metal layer deposited on source bonding pad 212 and gate bonding pad 213. In this case, by way of example, gold or silver can be coated on interconnected rods to replace the conductive adhesive material 203, and Pure tin (Sn) or gold-tin (AuSn), gold-silicon (AuSi), gold-germanium (AuGe) and other alloy materials can be coated on source bonding pad 212 and on gate bonding pad 213. When the lead frame 200 and interconnect rods 201 are heated to a suitable eutectic temperature, elements of gold or silver will penetrate into metal coatings. Source bonding pad 212 and gate bonding pad 213 are bonded with interconnect rods 201 after solidifying the eutectic layer of the metal coatings.

Figure 2D:
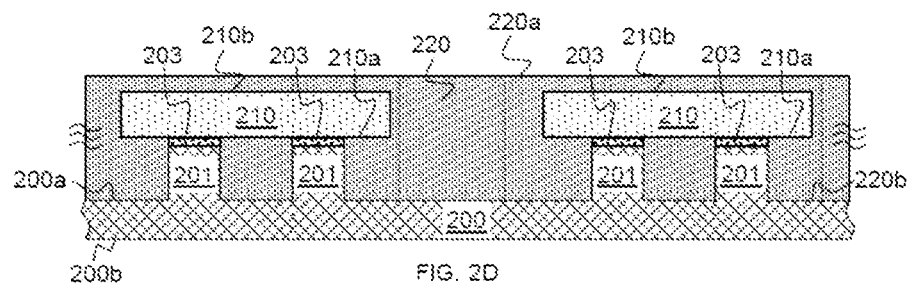

As shown in FIG. 2D, plastic molding is applied on top surface 200a of lead frame 200 to cover chips 210 and interconnect rods 201 with plastic packing material 220 with the gaps around chips 210 also packed with plastic packing material 220. In this case, bottom surface 220b of plastic packing material 220 interfaces with top surface 200a of lead frame 200. The plastic packing material 220 is typically epoxy materials.

Figure 2E:
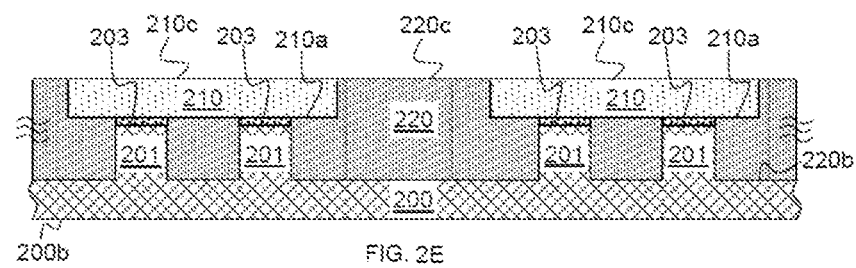

As shown in FIG. 2E, after completion of packaging process as in FIG. 2D, top surface 220a of plastic packing material 220 is ground until chips 210 are exposed from the plastic packing material 220. The grinding process may continue to reduce the thickness of chips 210 by grinding the back surface of chips 210. In this grinding process, the plastic packing material 220 surrounding the chips 210 provides support and protection to prevent chips 210 from cracking in thinning process. As such, chip 210 can obtain a thickness of 6 mil, 4 mil, 2 mil and even thinner. This greatly reduces the resistance of a vertical power semiconductor device since the resistance associated to the semiconductor substrate thickness has been greatly reduced. At this point, plastic packing material 220 and chip 210 are thinned by grinding, and the back surface 210c of thinned chip 210 can be exposed from top surface 220c of plastic packing material 220. The drain region of chip 210 is ground out and its thickness is also reduced.

Figure 2F:
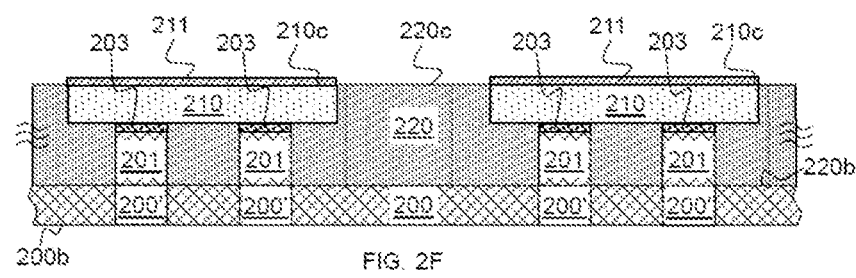

In FIG. 2E, an optional step of etching the back surface 210c of thinned chip 210 (such as wet etching) is performed for purpose of removing the residual stress layer on back surface 210c of ground chip 210 and of repairing the lattice damage to back surface 210c of thinned chip 210. Ion injection may then be optionally performed on back surface 210c of ground chip 210 and the lattice defects on back surface 210c of ground chip 210 removed by low-temperature annealing or laser annealing methods after the ion injection. In FIG. 2F, a layer of back surface metal 211 (such as Ti/Ni/Ag alloy) is deposited on the back surface 210c of chip 210 after its being thinned. As for the example in FIG. 4 with the chip 210 being a MOSFET, the metal layer 211 on exposed back surface is contacted with the drain region of chip 210 electrically, thus forms the drain electrode of chip 210.

Figure 2G:
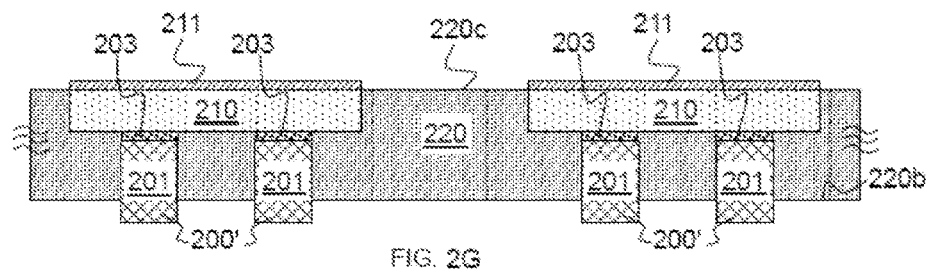

As shown in FIG. 2G, lead frame 200 is etched from its bottom surface 200b with a mask (not shown) to protect areas not to be etched. The contact terminals 200', which are part of the original lead frame 200 and connect to interconnect rods 201 in FIG. 2F, are retained and protrude from bottom surface 220b of plastic material 220 after the etching process as shown in FIG. 2G.

Figure 2H:
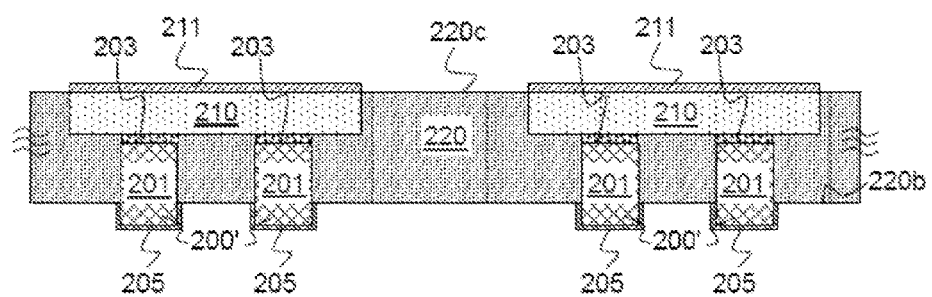

As shown in FIG. 2H, a metal protection layer 205 is formed coating on exposed surface of contact terminals 200', including the bottom surface and the exposed sidewall surface of the contact terminals. A number of materials of metal protection layer 205, such as Ti/Ni/Au alloy, can be selected. Alternatively, the metal protection layer 205 may be formed on the lead frame bottom surface 200b before the etching process.

Figure 2I:
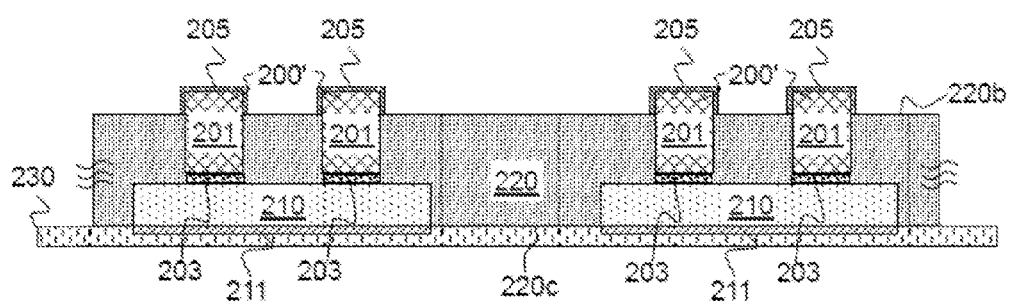
Figure 2J:
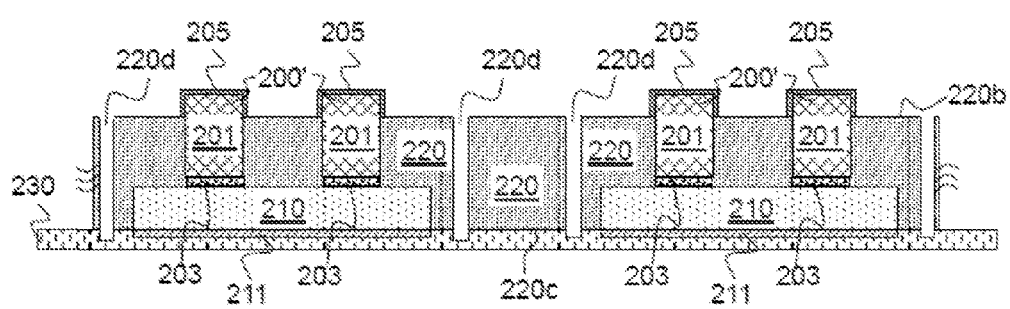
Figure 2K:
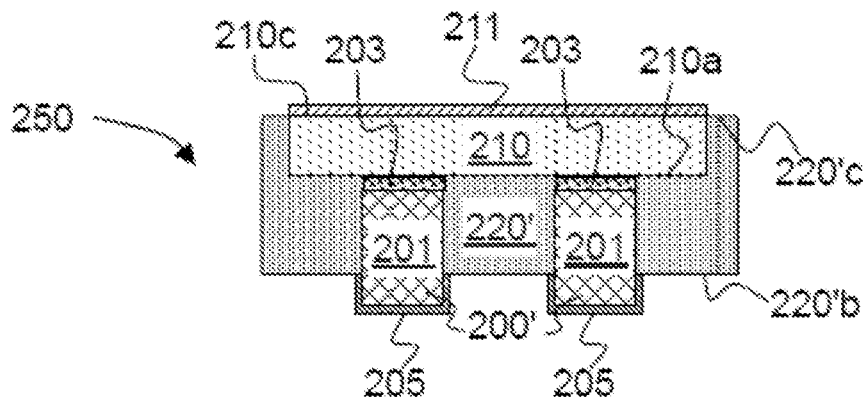
Figure 2L:
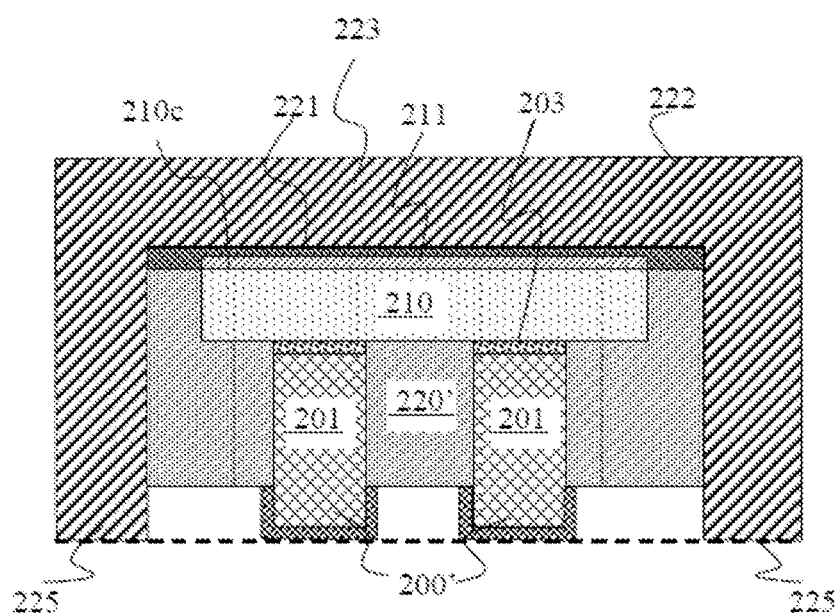

As shown in FIG. 2I-2J, a film 230 is pasted on the top surface 220c of thinned plastic packing material 220. By way of example, the ultraviolet radiation sensitive film (UV tape) or Blue tape can be used for film 230. Then plastic packing material 220 is cut with the cut slots 220d shown in FIG. 2J located between semiconductor chips 210. This step is to separate the chip 210 from each other. After completion of cutting plastic packing material 220, a number of semiconductor chips protected by plastic packing material with contact terminals attached to the electrodes of semiconductor chips and protrude from the bottom surface of the plastic packing material as shown in FIG. 2K are obtained. Film 230 is then removed from top surface 220'c of package 220' and a number of packages 250 that includes chip 210 are obtained. In package 250, the back metal layer 211 exposes from top surface 220'c of package 250, and the contact terminals 200' with metal protective layer 205 on its exposed surfaces protrude from the bottom surface 220'b of package 250. As shown in FIG. 2L, the package 250 may be further mounted to a clip structure 222 to complete the device. Typically, the back metal layer 211, i.e., the drain electrode of the chip 210, is mounted to a flat portion 223 of a clip structure, such as a U-shape clip, using a conductive epoxy or solder 221 with a downward portion 225 of the clip structure extending to a bottom surface coplanar to the bottom surface of the source and gate contact terminals 200'.

Figure 3A:
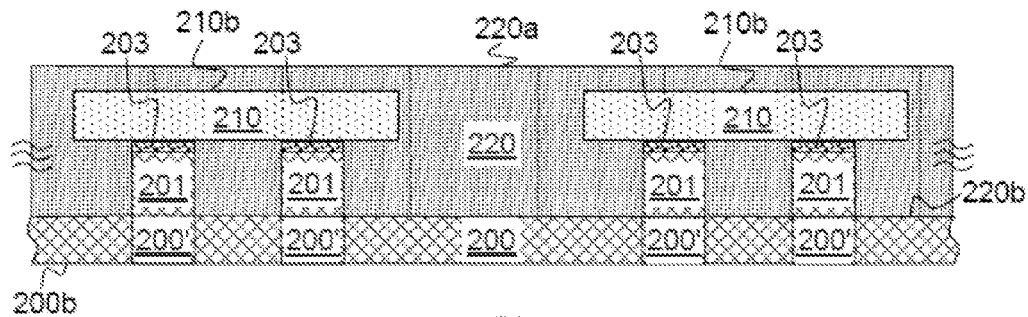
FIG. 3A-3D are cross-sectional views illustrating an alternative preparation process diagram of the chip package in this invention.
Figure 3B:
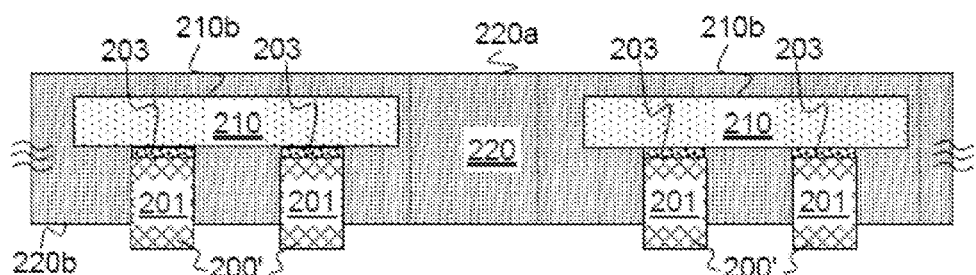
Figure 3C:
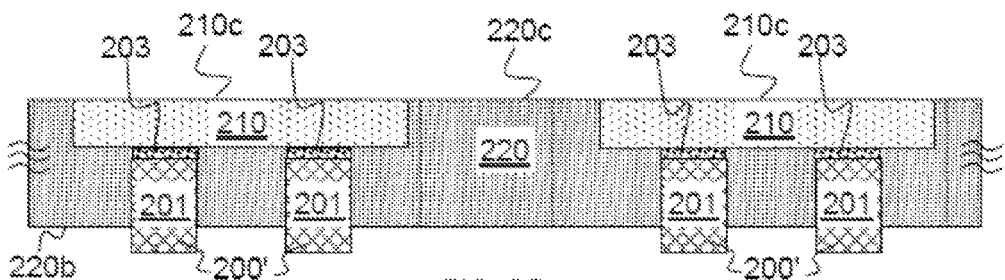
Figure 3D:
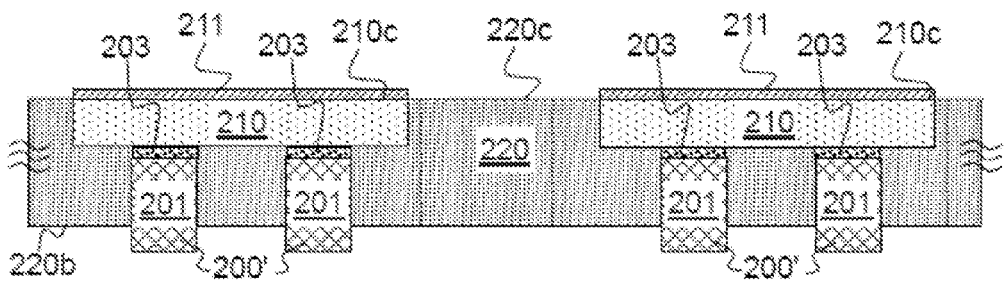

There are alternative processes to obtain the package 250 as shown in FIG. 2K. For example, after completion of the preparation process as shown in FIG. 2D, the process in FIG. 3A-3D is performed. FIG. 3A is equivalent with FIG. 2D. In FIG. 3B, lead frame 200 in FIG. 3A is etched firstly from its bottom surface 200b, with contact terminals 200' that are a part of the original lead frame 200 and connect to interconnect rods 201 being retained. The contact terminals 200' protrude from bottom surface 220b of plastic packing material 220 as shown in FIG. 3B. Then top surface 220a of plastic packing material 220 is ground until chip 210 is exposed from the plastic packing material 220 as shown in FIG. 3C. At this point, plastic packing material 220 and chip 210 are thinned by grinding, and the back surface 210c of thinned chip 210 is exposed from top surface 220c of plastic packing material 220, while the thickness of drain region of chip 210 is also reduced. In this stage, an optional step of etching the back surface 210c of thinned chip 210 (such as wet etching) for purpose of removing the residual stress layer arising on back surface 210c of ground chip 210 and of repairing the lattice damage to back surface 210c of chip 210 is performed. After that, ion injection is performed on back surface 210c of chip 210 and the lattice defects on back surface 210c of chip 210 is removed by low-temperature annealing or laser annealing methods after the ion injection. Then, as shown in FIG. 3D, a metal layer 211 (such as Ti/Ni/Ag alloy) is deposited on the back surface 210c of chip 210 after its being thinned. As for the example in FIG. 4, chip 210 is of MOSFET, and metal layer 211 on back surface is contacted with drain region of chip 210 electrically and forms the drain electrode of chip 210.

Comparing FIG. 3D with FIG. 2G, there is no difference between the two structures, but only in different production process. After completion of the preparation process as shown in FIG. 3D, the package 250 can also be obtained through the process in FIG. 2H-2L.

Figure 9:
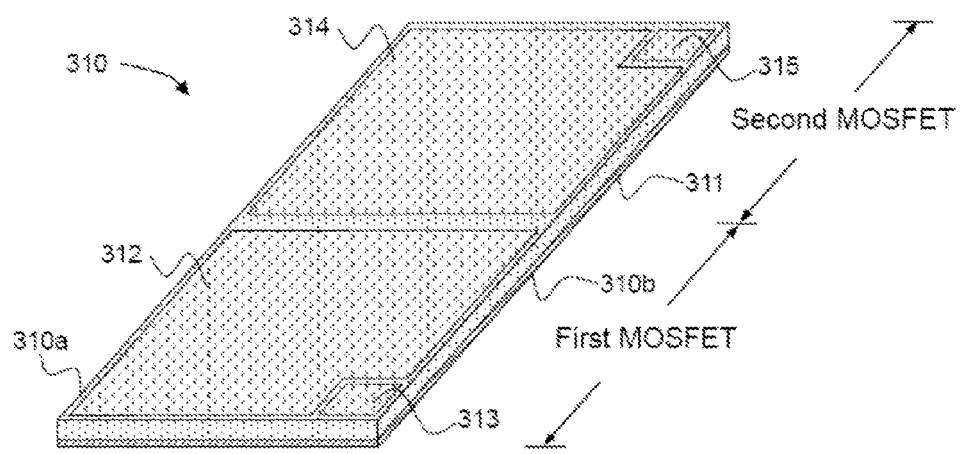
FIG. 9 is a 3-dimensional schematic diagram of a bi-MOSFET before it is packaged in this invention.

The chip can be a single transistor chip as shown in FIG. 4 or a bi-transistor chip as shown in FIG. 9.

Figure 5:
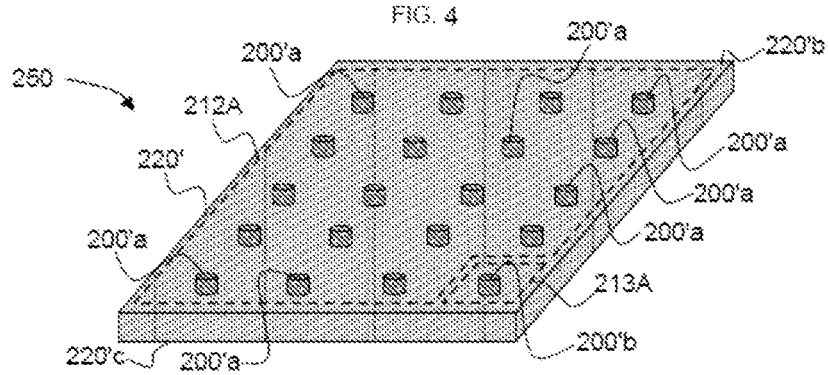
FIG. 5 is a 3-dimensional schematic diagram of the MOSFET after it is packaged for this invention.

FIG. 4 is a perspective view diagram of the original chip 210, while FIG. 5 is a perspective view diagram of package 250 that is obtained from chip 210 in FIG. 4 by performing the schematic process in FIG. 2A-2K and/or FIG. 3A-3D. Comparing the cross-section view of package 250 in FIG. 2K with the perspective view of package 250 in FIG. 5, back metal layer 211 on top surface 220'c of package 220' is not shown in FIG. 5, and contacts terminals 200' that are formed with metal protection layer 205 in FIG. 2K includes at least source contact terminals 200'a and gate contact terminals 200'b, in which, metal protection layer 205 is not shown in FIG. 5. In FIG. 5, contact terminals 200' within the dashed box 212A are all source contact terminal 200'a, and contact terminals 200' within the dashed box 213A are all gate contact terminals 200'b. Source bonding pad 212 and gate bonding pad 213 in FIG. 4 are not shown in FIG. 5 after they being covered by the package 220', with the location of dashed box 212A being just above the source bonding pad 212, and the location of dashed box 213A being just above the gate bonding pad 213, so that all of the source contact terminals 200'a are connected with source bonding pad 212 electrically through interconnect rods 201, while all of the gate contact terminals 200'b are connected with the gate bonding pad 213 electrically through interconnect rods 201 (see FIG. 2K).

Figure 6:
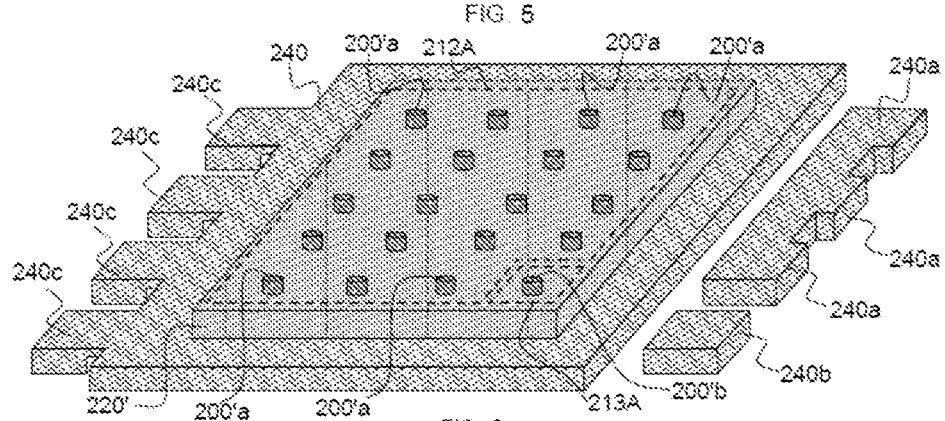
FIG. 6 is a 3-dimensional schematic diagram illustrating the package of FIG. 5 attached to a base for this invention.

The package 250 is used as a carrier of chip 210 and a second chip package are performed. As shown in FIG. 6, package 250 in FIG. 5 is mounted to a base 240 through the conductive material (such as solder paste, conductive silver paste), with the back metal layer 211 (not shown) in contact to the base 240 through conductive material. As such, the base 240 is electrically connected to the drain electrode of chip 210, with drain pins 240c formed around the base 240.

Figure 7:
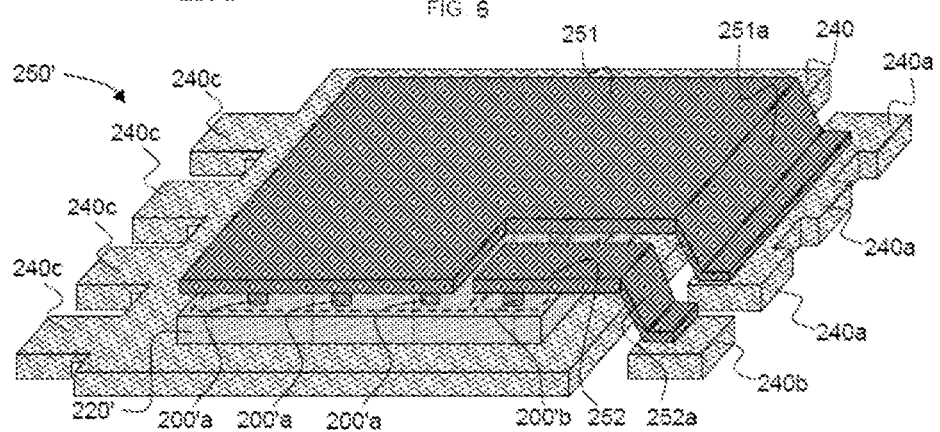
FIG. 7 is a 3-dimensional schematic diagram illustrating the connection of the gate bonding pad and source bonding pad to the gate pin and source pins respectively through the bent metal pieces.

In order to obtain the second package 250' as shown in FIG. 7, the gate contact terminal 200'b is electrically connected to a gate pin 240b formed around the base 240 through a bent metal piece 252. In other words, the contact terminals 200' that are connected with gate bonding pad 213 is connected to gate pin 240b through metal piece 252 electrically. Source contact terminals 200'a are electrically connected with source pins 240a formed around the base 240 through another bent metal piece 251. In other words, the contact terminals 200' that are connected with source bonding pad 212 is connected to source pins 240a through metal piece 251 electrically, in which, the bent part of metal piece 251 is connected with source pins 240a. If source pins 240a, gate pins 240b and drain pins 240c are coplanar with each other, the second package 250' can be plastic packaged again, in which, source pins 240a, gate pins 240b and drain pins 240c are connected with the outside circuit as leading pins, embodied respectively as the source electrode, gate electrode and drain electrode of chip 210. The metal piece 251 and 252 can be replaced with metal rod, metal strip or other metallic conductors for packaging of semiconductors.

In another example, plastic packaging materials and chips do not need to be thinned by grinding. A preparation process is shown in FIG. 8A-8F. It is noted that the structure shown in FIG. 8A can be obtained through the preparation methods as shown in FIG. 2A-2D. The chip can be a bi-MOSFET structure as shown in FIG. 9 or any chips without electrode in its bottom, or electrode in its bottom does not need to be exposed. The preparation process as shown in FIG. 8A-8F is illustrated with the chip 310 shown in FIG. 9. An alternative type of chip 310 is a bi-MOSFET that is integrated with a high-end MOSFET and a lower-end MOSFET. For example, as shown in FIG. 9, the first MOSFET is high-end MOSFET, while the second MOSFET is lower-end MOSFET. In FIG. 9, back surface 310b of chip 310 has a back metal layer 311 originally. In an alternative example, back surface 310b of chip 310 does not have the back metal layer 311. The top surface 310a of chip 310 is formed with bonding pads, as shown in FIG. 9, which include at least the first gate bonding pad 313 that forms gate electrode of the first MOSFET and the first drain bonding pad 312 that forms drain electrode of the first MOSFET. The first gate bonding pad 313 contacts the gate region of the first MOSFET electrically, and the first drain bonding pad 312 contacts the drain region of the first MOSFET electrically. The bonding pads also include the second gate bonding pad 315 that forms the gate electrode of the second MOSFET and the second source bonding pad 314 that forms the source electrode of the second MOSFET. The second gate bonding pad 315 contacts the gate region of the second MOSFET electrically, while the second source bonding pad 314 contacts the source region of the second MOSFET electrically. The first and second MOSFETs are both integrated on chip 310, which are not obviously shown separately in FIG. 9, in which, the source region of the first MOSFET and the drain region of the second MOSFET are located on the back surface 310b of chip 310 and contacts with back metal layer 311 electrically, as such the back metal layer 311 forms the source electrode of the first MOSFET and the drain electrode of the second MOSFET. In case chip 310 does not include a back metal layer 311 on the back surface 310b, the source region of the first MOSFET and the drain region of the second MOSFET are connected electrically with each other through the semiconductor substrate on back surface of chip. For the chip 310 with above said structure, its first MOSFET is a high-end or high-side MOSFET (High Side MOSFET), while its second MOSFET is a low-end or low-side MOSFET (Low Side MOSFET).

Figure 8:
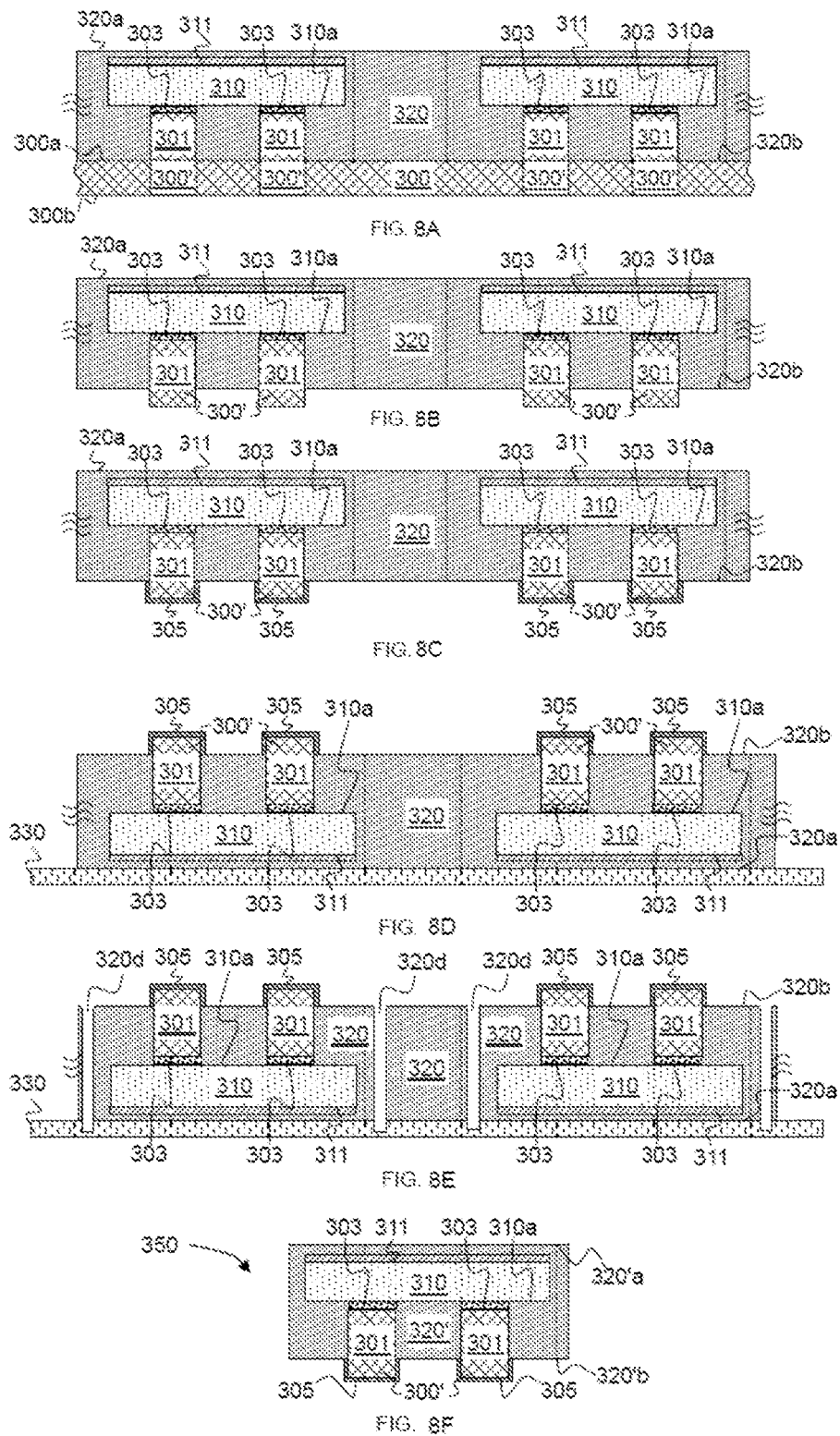
FIGS. 8A-8F are cross-sectional views illustrating a preparation process diagram of another chip package in this invention.

As shown in FIG. 8A, semiconductor chip 310 connected to the lead frame 300 with bonding pads connected to interconnect rods 301, which may be formed with the preparation method shown in FIG. 2A-2C, is plastically packaged with the plastic packing material 320, with the back metal layer 311 of chip 310 being completely plastically packaged. Then, lead frame 300 is etched from its bottom surface 300b using a hard mask (not shown) to protect areas not to be etched. The contact terminals 300', which are part of the original lead frame 300 and connect to interconnect rods 301, are retained. Contact terminals 300' protrude from bottom surface 320b of plastic packing material 320 after the etching process as shown in FIG. 8B.

As shown in FIG. 8C, a metal protection layer 305 is formed coating on exposed surface of contact terminals 300', including the bottom surface and the exposed sidewall surface of the contact terminals. By way of example, a number of materials of metal protection layer 305, such as Ti/Ni/Au alloy can be selected. In this process, top surface 320a of plastic packing materials 320 is not required to be ground, and the thickness of chip 310 is also not required to be thinned. Alternatively, the metal protection layer 305 may be formed on the lead frame bottom surface 300b before the etching process.

Then, as shown in FIG. 8D, a film 330 is pasted directly to the top surface 320a of plastic packing materials 320 followed by the cutting of the plastic packing materials 320 with the cut slots 320d located between semiconductor chips 310 as shown in FIG. 8E. This step is to separate the chip 310 from each other. After completion of cutting plastic packing materials 320, a number of semiconductor chips protected by plastic packing material with contact terminals attached to the electrodes of semiconductor chips and protrude from the bottom surface of the plastic packing material as shown in FIG. 8F are obtained. Film 330 is then removed from top surface 320'a of package 320' and a number of package 350 that includes chip 310 are obtained. In package 350, contact terminals 300' coated with metal protection layer 305 protrude from bottom surface 320'b of plastic packing materials 320'.

Figure 10:
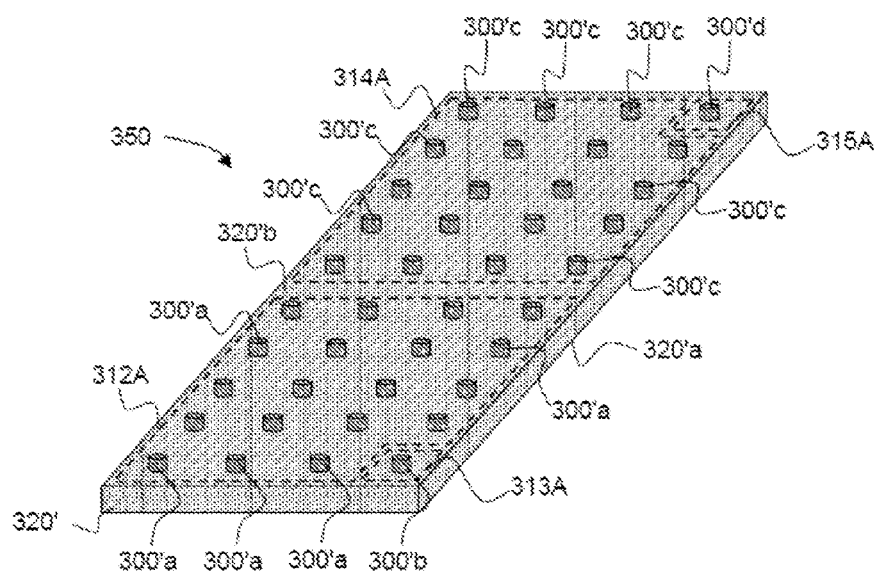
FIG. 10 is a 3-dimensional schematic diagram of the bi-MOSFET after it is packaged in this invention.

FIG. 10 is a perspective view of package 350 in FIG. 8F that is obtained after completion of the above packaging process for chip 310 in FIG. 9, which includes first and second MOSFETs. Contact terminals 300' that are formed with metal protective layer 305 in FIG. 8F include at least the first drain contact terminals 300'a, the first gate contact terminals 300'b, the second source contact terminals 300'c and the second gate contact terminals 300'd, where the metal protective layer 305 is not shown in FIG. 10. In FIG. 10, the contact terminals 300' within the dashed box 312A are all the first drain contact terminals 300'a; the contact terminals 300' within the dashed box 313A are all the first gate contact terminals 300'b; the contact terminals 300' within the dashed box 314A are all the second source contact terminals 300'c; the contact terminals 300' within the dashed box 315A are all the second gate contact terminals 300'd. The first drain bonding pad 312, the first gate bonding pad 313, the second source bonding pad 314 and the second gate bonding pad 315 of FIG. 9 are not shown in FIG. 10 after being covered by the plastic package 320'. The dashed box 312A is located directly above the first drain bonding pad 312; the dashed box 313A is located directly above the first gate bonding pad 313; the dashed box 314A is located directly above the second source bonding pad 314; and the dashed box 315A is located directly above the second gate bonding pad 315. So, the first drain contact terminals 300'a are all connected electrically with the first drain bonding pad 312 through interconnect rods 301; the first gate contact terminals 300'b are all connected electrically with the first gate bonding pad 313 through interconnect rods 301 (see FIG. 8F); the second source contact terminals 300'c are all connected electrically with the second source bonding pad 314 through interconnect rods 301; the second gate contact terminals 300'd are all connected electrically with the second gate bonding pad 315 through interconnect rods 301.

The chip 310 of FIG. 9 can be a common drain bi-metal oxide semiconductor field effect transistor (or common drain dual MOSFET) device. In this device, the gate region and source region of the first and second MOSFETs are all located on the top surface 310a of chip 310, while the drain region of the first and second MOSFETs are both located on the back surface 310b of chip 310 and contact with back metal layer 311 electrically. Thus, the bonding pads set on top surface of the chip 310 include at least the first gate bonding pad of the first MOSFET's gate electrode, the first source bonding pad of first MOSFET's source electrode; the second gate bonding pad of the second MOSFET's gate electrode, the second source bonding pad of the second MOSFET's source electrode. The back metal layer 311 forms drain electrode of the first and second MOSFETs with the drain electrode of the first and second MOSFET connected electrically with each other through the back metal layer 311. If there is no back metal layer 311 on back surface 310b on chip 310, the drain region of the first and second MOSFETs is connected electrically with each other through the semiconductor substrate on back surface of the chip. In other words, as shown in FIG. 9, chip 310 is integrated by high-end MOSFET and lower-end MOSFET.

In an example, when chip 310 is a common drain bi-MOSFET including a first and a second MOSFEts, the first gate bonding pads 313 becomes the first gate bonding pad of the first MOSFET and the first source bonding pad 312 becomes the first source bonding pad of the first MOSFET.

The second source bonding pad 314 becomes the second source bonding pad of the second MOSFET and the second gate bonding pads 315 becomes the second gate bonding pads in common drain bi-MOSFET.

The package 350 in FIG. 10 is different from the package 250 in FIG. 5 such as the package 350 does not need to add additional metal pieces of 251 and 252, with the input/output contact terminals formed at sides of chip. The contact terminals 300' of package 350 can be directly installed on the substrate such as PCB and the like. Therefore, as shown in FIG. 9, if the I/O bonding pad of internal circuitry of chip 310 is all at top surface 310a of chip 310. The structure of package 350 can also be prepared by the method as shown in FIG. 8A-8F even the chip 310 is not a bi-MOSFET.

In the above process of forming the package 250, the grinding process to reduce the thickness of the chips is performed with the plastic packing material surrounding the chips providing support and protection that prevents the chip from cracking or losing its angle even the chips' thickness being 2 mil or thinner and, which results in a better yield rate of final packages.

Figure 1A:
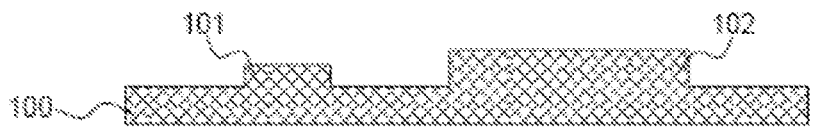
FIGS. 1A-1J are cross-sectional views illustrating a preparation process diagram of FBP (Flat Bump Package) in the conventional technologies.
Figure 1B:
Figure 1C:
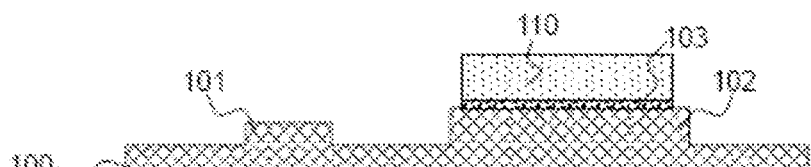
Figure 1D:
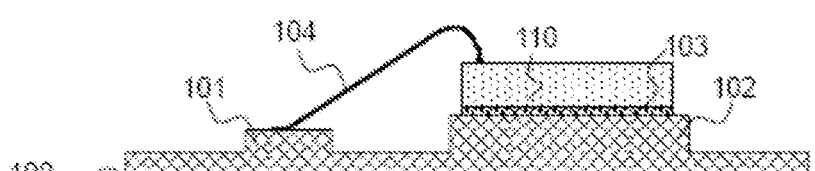
Figure 1E:
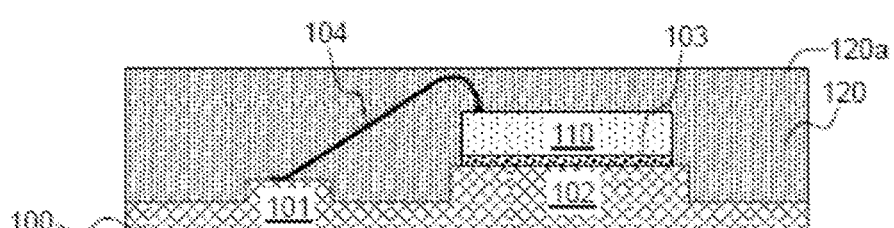
Figure 1F:
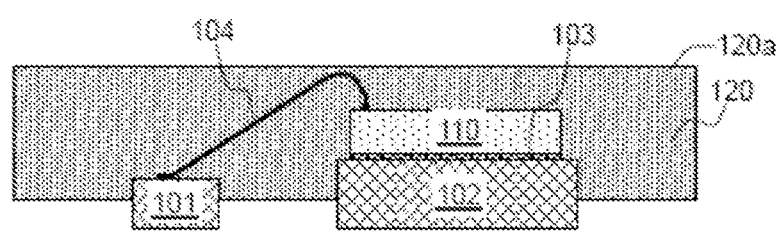
Figure 1G:
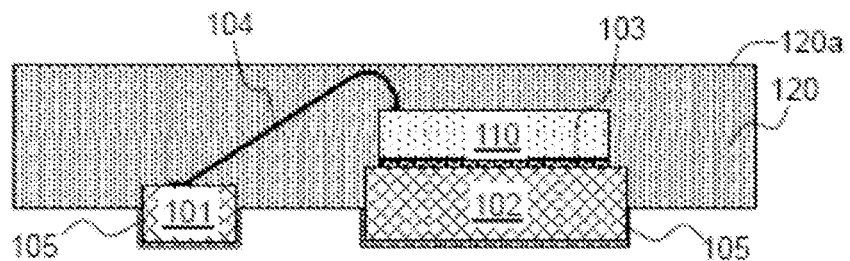
Figure 1H:
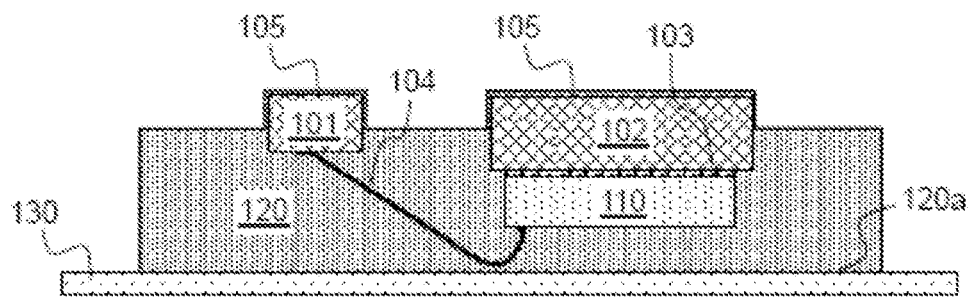
Figure 1I:
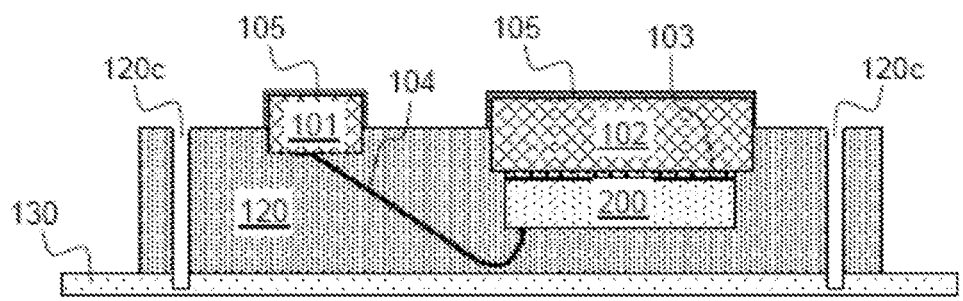
Figure 1J:
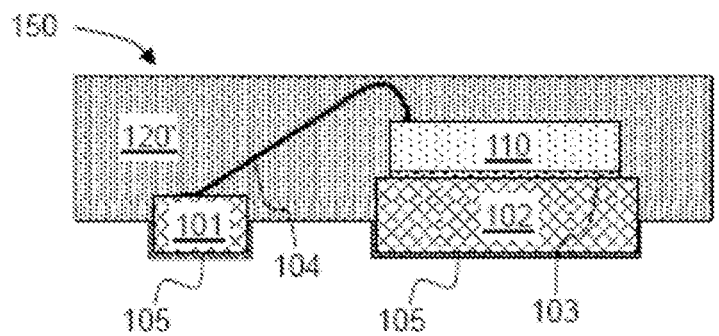

In all above process, the contact terminals are formed by etching back surface of lead frame, which ensures absolute coplanarity of contact terminals. The use of solder paste in welding contact terminals on circuit board is easier and more secure, protecting their good binding ability with PCB. In addition to the good heat dissipation ability of the high purity copper material, the special structure of the contact terminals connecting with the bonding pad also make these packages being cooled indirectly through contact terminal spaces, improving overall heat dissipation ability. On the other hand, the bonding pad 102 as shown in FIG. 1C of the conventional technologies must maintain a similar size of chip 110, which results a potential crack risk in eutectic welding of chip 110 on bonding pad. In this invention, the bonding pad 102 is replaced by a number of dispersed contact terminals, which can avoid those defects effectively.

A typical example of specific structure for concrete implementation methods are given through the description and drawings. For example, this case is described based on a MOSFET, bi-MOSFET, and based on the spirit of this invention, chip is also available in other types of conversion. Although the existing preferred examples are provided for this invention, it shall not be considered as a limit.

After reading of the above said descriptions, the variations and changes are obvious with no doubt for the technical staff in this field. Therefore, the appended claims shall be considered as all the changes and amendments that cover the real intentions and scope of this invention. Any and all equivalent scope and content within the claims should be considered to be in conformance with the intent of this invention.

The invention claimed is:

1. A flip-chip semiconductor chip packing method comprising:
  providing a lead frame, said lead frame includes a number of interconnect rods protruding from its top surface;
  flip chip mounting a semiconductor chip onto said lead frame, said semiconductor chip comprising a plurality of bonding pads on a first surface, wherein each of said plurality of bonding pads on the first surface interfacing an entire top surface of one of said interconnect rods;
  encapsulating said chip and said interconnect rods with a plastic packing material; and
  grinding said plastic packing materials and a second surface of said semiconductor chip opposite to said first surface to thin said semiconductor chip to a predetermined thickness after said semiconductor chip being encapsulated with said plastic packing materials;

depositing a metal layer on an exposed back surface of said semiconductor chip after it being thinned;

etching said lead frame from its bottom surface to form contact terminals that are connected to said interconnect rods, said contact terminals protrude from a bottom surface of said plastic packing material; wherein said contact terminals protrude out from said bottom surface of said plastic packing material while said metal layer on said exposed back surface of said semiconductor chip exposed from said top surface of plastic packing materials;

pasting a film to a top surface of said plastic packing materials; and cutting through said plastic packing material to form a package encapsulating said semiconductor chip.

2. The method of claim 1, wherein said bonding pads are connected to the said interconnect rods through a conductive material coated on said interconnect rods.

3. The method of claim 1, wherein said bonding pads are eutectically connected to said interconnect rods through a metal layer deposited on said interconnect rods and a metal layer deposited on said bonding pads.

4. The method of claim 1 further comprises coating a metal protective layer on an entire exposed surface of said contact terminals after etching said lead frame from its bottom surface.

5. The method of claim 1 further comprises coating a metal protective layer on a bottom surface of said lead frame before etching said lead frame from its bottom surface.

6. The method of claim 1 wherein etching said lead frame from its bottom surface to form contact terminals that are connected to said interconnect rods further aligns the contact terminals to the interconnect rods.

7. The method of claim 6 wherein a flat end surface of each contact terminals has an area substantially the same as an area of a corresponding interconnect rod.

8. The method of claim 1, wherein said semiconductor chip is a metal-oxide-semiconductor field effect transistor (MOSFET), and said bonding pads include at least a gate electrode bonding pad forming a gate electrode of said semiconductor chip and a source electrode bonding pad forming a source electrode of said semiconductor chip, while said metal layer on said exposed back surface of said semiconductor chip forms a drain electrode of said semiconductor chip.

9. The method of claim 8, wherein said package is mounted to a base, wherein said metal layer on said exposed back surface of said semiconductor chip is disposed on and connected to said base through a conductive adhesive material, and wherein said contact terminal connecting said gate bonding pad is connected to a gate pin formed around said base through an electrical connection of a metal conductor, and wherein said contact terminals connecting said source bonding pad are connected to a source pin that formed around said base through an electrical connection of a metal conductor.

10. The method of claim 1, wherein said semiconductor chip is a common drain dual-MOSFET including a first and a second MOSFETs, wherein said metal layer on said exposed back surface of said semiconductor chip forms respective drain electrodes of the first and second MOSFETs, and wherein said respective drain electrodes of the first and second MOSFETs are connected to each other through said metal layer on said exposed back surface of said semiconductor chip electrically.

11. The method of claim 10, wherein said bonding pads includes at least a first gate bonding pad forming a gate electrode of said first MOSFET and first source bonding pad forming a source electrode in the first MOSFET; and wherein said bonding pads also includes a second gate bonding pad forming a gate electrode of the second MOSFET and a second source bonding pad forming a source electrode in said second MOSFET.

12. The method of claim 1, wherein said semiconductor chip is a dual-MOSFET that is integrated with a high-end MOSFET and a lower-end MOSFET, wherein said metal layer on said exposed back surface forms a source electrode of said high-end MOSFET and a drain electrode of said lower-end MOSFET, and wherein said source electrode of high-end MOSFET and said drain electrode of said lower-end MOSFET are connected to each other through said metal layer on said exposed back surface.

13. The method of claim 12, wherein bonding pads include at least a first gate bonding pad forming a gate electrode of said high-end MOSFET and first drain bonding pad forming a drain electrode in the high-end MOSFET, and wherein said bonding pads also include a second gate bonding pads forming a gate electrode of said lower-end MOSFET and a second source bonding pad forming a source electrode in said lower-end MOSFET.

14. The method of claim 1, wherein said semiconductor chip is a common drain dual-MOSFET comprising a first and a second MOSFETs, wherein a second surface of said semiconductor chip opposite to said first surface forms respective drain electrodes of said first and second MOSFETs.

15. The method of claim 14, wherein a metal layer is coated on said second surface of said semiconductor chip, and said respective drain electrodes of the first and second MOSFETs are connected with each other through said metal layer electrically.

16. The method of claim 1, wherein said semiconductor chip is a dual-MOSFET that is integrated with a high-end MOSFET and a lower-end MOSFET, wherein a second surface of said semiconductor chip opposite to said first surface forms a source electrode of said high-end MOSFET and a drain electrode of said lower-end MOSFET.

17. The method of claim 16, wherein a metal layer is coated on said second surface of said semiconductor chip, and said source electrode of said high-end MOSFET and said drain electrode of said lower-end MOSFET are connected to each other through said metal layer on second surface electrically.

18. The method of claim 8, further comprising attaching a conductive structure to said metal layer on said exposed back surface of said semiconductor chip, wherein said conductive structure comprising a flat portion attached to said metal layer, and a downward portion extending to a surface coplanar to a bottom of said contact terminals.

* * * * *